United States Patent
Nobunaga

(10) Patent No.: US 10,127,960 B1
(45) Date of Patent: Nov. 13, 2018

(54) TRANSIENT SENSING OF MEMORY CELLS

(71) Applicant: Avalanche Technology, Inc., Fremont, CA (US)

(72) Inventor: Dean K. Nobunaga, Cupertino, CA (US)

(73) Assignee: Avalanche Technology, Inc., Fremont, CA (US)

( * ) Notice: Subject to any disclaimer, the term of this patent is extended or adjusted under 35 U.S.C. 154(b) by 0 days.

(21) Appl. No.: 15/594,387

(22) Filed: May 12, 2017

(51) Int. Cl.
*G11C 11/00* (2006.01)
*G11C 11/16* (2006.01)

(52) U.S. Cl.
CPC .............................. *G11C 11/1673* (2013.01)

(58) Field of Classification Search
CPC ................................................ G11C 11/1673
USPC ....................................................... 365/158
See application file for complete search history.

(56) References Cited

U.S. PATENT DOCUMENTS

| | | |
|---|---|---|
| 8,824,190 B1 | 9/2014 | Kim et al. |
| 9,058,852 B2 | 6/2015 | Kim et al. |
| 2010/0097852 A1* | 4/2010 | Chen .................... G11C 11/1659 365/171 |
| 2014/0104925 A1* | 4/2014 | Azuma ................ G11C 13/004 365/148 |

* cited by examiner

*Primary Examiner* — Tha-O H Bui
(74) *Attorney, Agent, or Firm* — Bing K. Yen

(57) ABSTRACT

The present invention is directed to a method for sensing the resistance state of a memory cell, which includes a memory element and a two-terminal selector coupled in series between first and second conductive lines. The method includes the steps of precharging at least the first conductive line to attain a potential drop across the memory cell that is sufficiently large to turn on the two-terminal selector; allowing the voltage of the first conductive line to decay by discharging through the second conductive line; measuring the voltage of the first conductive line after a discharge period to determine the resistance state of the memory cell; concluding that the memory cell is in the high resistance state if the measured voltage is greater than a reference level; and concluding that the memory cell is in the low resistance state if the measured voltage is less than the reference level.

13 Claims, 11 Drawing Sheets

TRANSIENT SENSING OF MEMORY CELLS

BACKGROUND

The present invention relates to a memory device, and more particularly, to a circuit and method for sensing the memory cells of the memory device.

A resistance-based memory device normally comprises an array of memory cells, each of which includes a memory element and a selection element, such as transistor, coupled in series between two electrodes. The selection element functions like a switch to direct current or voltage through the selected memory element coupled thereto. Upon application of an appropriate voltage or current to the selected memory element, the resistance of the memory element would change accordingly, thereby switching the stored logic in the respective memory cell.

FIG. 1 is a schematic circuit diagram of a memory array 20, which comprises a plurality of memory cells 22 with each of the memory cells 22 including a selection transistor 24 coupled to a resistance-based memory element 26; a plurality of parallel word lines 28 with each being coupled to the gates of a respective row of the selection transistors 24 in a first direction; a plurality of parallel bit lines 30 with each being coupled to a respective row of the memory elements 26 in a second direction substantially perpendicular to the first direction; and a plurality of parallel source lines 32 with each being coupled to a respective row of the selection transistors 24 in the first or second direction.

Alternatively, the selection transistor 24 in the memory cell 22 may be replaced by a two-terminal bi-directional selector to simplify the wiring scheme and allow stacking of multiple levels of memory arrays. FIG. 2 is a schematic circuit diagram of a memory array 40 incorporating therein two-terminal selectors as selection elements. The memory array 40 comprises a plurality of memory cells 42 with each of the memory cells 42 including a two-terminal bi-directional selector 44 coupled to a resistance-based memory element 46 in series; a first plurality of parallel conductive lines 48A-C with each being coupled to a respective row of the memory elements 46 in a first direction; and a second plurality of parallel conductive lines 50A-C with each being coupled to a respective row of the two-terminal selectors 44 in a second direction substantially perpendicular to the first direction. Accordingly, the memory cells 42 are located at the cross points between the first and second plurality of conductive lines 48A-C and 50A-C. The first and second plurality of conductive lines 48A-C and 50A-C may be bit lines and word lines, respectively, or vice versa. Multiple layers of the memory array 40 may be stacked to form a monolithic three-dimensional memory device.

The resistance-based memory elements 26 or 46 may be classified into at least one of several known groups based on their resistance switching mechanism. The memory element of Phase Change Random Access Memory (PCRAM) may comprise a phase change chalcogenide compound, which can switch between a resistive phase (amorphous or crystalline) and a conductive crystalline phase. The memory element of Conductive Bridging Random Access Memory (CBRAM) relies on the statistical bridging of metal rich precipitates therein for its switching mechanism. The memory element of CBRAM normally comprises a nominally insulating metal oxide material, which can switch to a lower electrical resistance state as the metal rich precipitates grow and link to form conductive paths upon application of an appropriate voltage. The memory element of Magnetic Random Access Memory (MRAM) typically comprises at least two layers of ferromagnetic materials with an insulating tunnel junction layer interposed therebetween. When a switching current is applied to the memory element of an MRAM device, one of the ferromagnetic layers will switch its magnetization direction with respect to that of the other magnetic layer, thereby changing the electrical resistance of the element.

FIG. 3 shows an exemplary current-voltage (I-V) response plot for a bi-directional two-terminal selector. The I-V response curve 60 shows the magnitude of electric current passing through the two-terminal selector element as the voltage applied thereto varies. Initially, the current slightly increases with the applied voltage from zero to near a threshold voltage, $V_{th}$. At or near $V_{th}$, the current rapidly increases and exhibits a highly non-linear exponential behavior, indicating a transition of the selector from a nominally insulative or "off" state to a nominally conductive or "on" state. As the selector voltage continues to increase beyond $V_{th}$, the current increase becomes gradual until reaching $V_P$, which may be the programming voltage required to drive a switching current through a memory element coupled to the selector. The current response behaves like a step function as the applied voltage increases from zero to $V_P$ with the sharp increase occurring at or near $V_{th}$, which may be about 60-80% of $V_P$. As will be shown later, during the programming operation, the unselected memory cells coupled to either the selected word line or the selected bit line are subjected to a net applied voltage equivalent to about half the programming voltage. Therefore, the leakage current, $I_{leak}$, for the selector in the "off" state is measured at the selector voltage of $V_P/2$. The ratio of $I_{on}$, which is the selector current at $V_P$, to $I_{leak}$ measured at $V_P/2$ is sometimes referred to as "on/off ratio."

With continuing reference to FIG. 3, as the selector voltage decreases from $V_P$ to near a holding voltage, $V_{hold}$, which is lower than $V_{th}$, the selector current gradually decreases and the selector remains in the conductive state. At or near $V_{hold}$, the current rapidly decreases and exhibits a highly non-linear behavior, indicating a transition from the nominally conductive state back to the nominally insulative state. As the voltage continues to decrease beyond $V_{hold}$, the current flow slightly decreases until stopping at about 0 V.

The I-V response curve 60 of the selector behaves like a hysteresis loop. The nominally insulating selector turns on or becomes conductive when the selector voltage exceeds $V_{th}$. Once in the conductive state, the selector will stay on or remain conductive until the selector voltage dropping below $V_{hold}$, which is less than $V_{th}$. In a conventional write or programming operation, the selector is first turned on by raising the selector voltage to about $V_{th}$. The selector voltage is then further increased to a higher level $V_P$ that is sufficient to drive a current $I_{on}$ for switching the resistance state of the memory element coupled thereto. In a conventional read or sensing operation, the selector is first turned on by raising the selector voltage to about $V_{th}$. The selector voltage is then decreased to a level between $V_{th}$ and $V_{hold}$ to minimize "read disturbance" while ensuring that the selector is sufficiently conductive to allow a sensing current to pass therethrough for determining the resistance state of the memory element.

The two-terminal selector characterized by the I-V response plot of FIG. 3 is bi-directional as the polarity of the selector voltage may be reversed from zero to $V'_P$ as shown. The I-V response curve 60' corresponding to the opposite polarity may be substantially similar to the curve 60 described above. The two response curves 60 and 60' for the selector are therefore substantially "symmetric" with respect to the current (vertical) axis at Selector Voltage=0. However, a selector may alternatively have an "asymmetric" profile in which at least one of the parameters, $V_P$, $V_{th}$, $V_{hold}$, and $I_{on}$, is not symmetric.

A bi-directional selector may alternatively have an I-V response shown in FIG. 4. The I-V response plot of FIG. 4 differs from the I-V response plot of FIG. 3 in that after the selector is turned on at $V_{th}$, the current remains substantially constant with continuously increasing selector voltage or decreasing selector voltage until reaching $V_{hold}$, below which the selector is turned off. The constant current is sometimes referred to as "compliance current" ($I_{cc}$).

FIG. 5 illustrates a scheme for selecting a memory cell in the memory array 40 of FIG. 2 for sensing or programming by turning on the selector of the cell. Referring now to FIG. 5, the memory cell 42BB is selected by applying a voltage, V, to one of the first conductive lines 48B coupled thereto, while grounding one of the second conductive lines 50B connected to the memory cell 42BB, thereby generating a potential difference of V across the memory cell 42BB. Meanwhile, to minimize current leakage and prevent accidental programming of the unselected memory cells, a voltage of about V/2 is applied to the unselected second conductive lines 50A, 50C-D, and the unselected first conductive lines 48A, 48C, resulting in a potential difference of V/2 across the unselected memory cells 42BA, 42AB, 42CB, 42DB, 42BC that are coupled to either the selected first conductive line 48B or the selected second conductive line 50B. The cell voltage of V is greater than $V_{th}$ to ensure that the selector of the selected memory cell 42BB becomes conductive, while the cell voltage of V/2 is not high enough for the selectors of the unselected memory cells 42BA, 42BC, 42AB, 42CB, and 42DB to become conductive. The rest of the unselected memory cells 42AA, 42CA, 42DA, 42AC, 42CC, and 42DC that are not connected to the selected first conductive line 48B or the selected second conductive line 50B experience essentially no potential drop thereacross.

In a conventional read or sensing operation for determining the resistance state of the selected memory cell 42BB in the memory array 40, a read current is applied to the selected memory cell 42BB after the selector is turned on and the resulting cell voltage is measured and compared to a reference value. Alternatively, a read voltage may be applied to the selected memory cell 42BB after the selector is turned on and the resulting current is measured and compared to a reference value to determine the resistance state.

Some types of resistance-based memory elements, such as MRAM, have almost unlimited read/write endurance but relatively smaller sensing margin compared with other types of memory elements, such as phase change random access memory (PCRAM) and resistive random access memory (ReRAM). The resistance ratio of high-to-low resistance state of MRAM is about 2-4, compared with $10^2$-$10^5$ for PCRAM and ReRAM. Therefore, there is a need for a sensing scheme with increasing sensing margin to accommodate all types of memory elements.

SUMMARY

The present invention is directed to a method for sensing the resistance state of a memory cell, which includes a memory element and a two-terminal selector coupled in series between first and second conductive lines. A method having features of the present invention includes the steps of precharging at least the first conductive line to attain a potential drop across the memory cell that is sufficiently large to turn on the two-terminal selector; allowing the voltage of the first conductive line to decay by discharging through the second conductive line; measuring the voltage of the first conductive line after a discharge period to determine the resistance state of the memory cell; concluding that the memory cell is in the high resistance state if the measured voltage is greater than a reference level; and concluding that the memory cell is in the low resistance state if the measured voltage is less than the reference level.

According to another aspect of the present invention, a method for sensing the resistance state of a memory cell, which includes a memory element and a two-terminal selector coupled in series between first and second conductive lines, including the steps of precharging at least the first conductive line to attain a potential drop across the memory cell that is sufficiently large to turn on the two-terminal selector; allowing the voltage of the first conductive line to decay by discharging through the second conductive line; and measuring the voltage of the first conductive line after a first discharge period and a second discharge period and calculating the voltage difference to determine the resistance state of the memory cell; concluding that the memory cell is in the low resistance state if the voltage difference is greater than a reference value; and concluding that the memory cell is in the high resistance state if the voltage difference is less than the reference value.

According to still another aspect of the present invention, a method for sensing the resistance state of a memory cell, which includes a memory element and a selection transistor coupled in series between first and second conductive lines, including the steps of precharging at least the first conductive line to a first voltage; allowing the voltage of the first conductive line to decay by discharging through the second conductive line; measuring the voltage of the first conductive line after a discharge period to determine the resistance state of the memory cell; concluding that the memory cell is in a high resistance state if the measured voltage is greater than a reference level; and concluding that the memory cell is in a low resistance state if the measured voltage is less than the reference level.

BRIEF DESCRIPTION OF THE DRAWINGS

These and other features, aspects, and advantages of the present invention will become better understood with regard to the following description, appended claims, and accompanying drawings where:

For purposes of clarity and brevity, like elements and components will bear the same designations and numbering throughout the Figures, which are not necessarily drawn to scale.

DETAILED DESCRIPTION

Where reference is made herein to a material AB composed of element A and element B, the material AB can be an alloy, a compound, or a combination thereof, except where the context excludes that possibility.

Where reference is made herein to a method comprising two or more defined steps, the defined steps can be carried out in any order or simultaneously (except where the context excludes that possibility), and the method can include one or more other steps which are carried out before any of the defined steps, between two of the defined steps, or after all the defined steps (except where the context excludes that possibility).

The term "at least" followed by a number is used herein to denote the start of a range beginning with that number, which may be a range having an upper limit or no upper limit, depending on the variable being defined. For example, "at least 1" means 1 or more than 1. The term "at most" followed by a number is used herein to denote the end of a range ending with that number, which may be a range having 1 or 0 as its lower limit, or a range having no lower limit, depending upon the variable being defined. For example, "at most 4" means 4 or less than 4, and "at most 40%" means 40% or less than 40%. When, in this specification, a range is given as "a first number to a second number" or "a first number-a second number," this means a range whose lower limit is the first number and whose upper limit is the second number. For example, "25 to 100 nm" means a range whose lower limit is 25 nm and whose upper limit is 100 nm.

Figure 5:
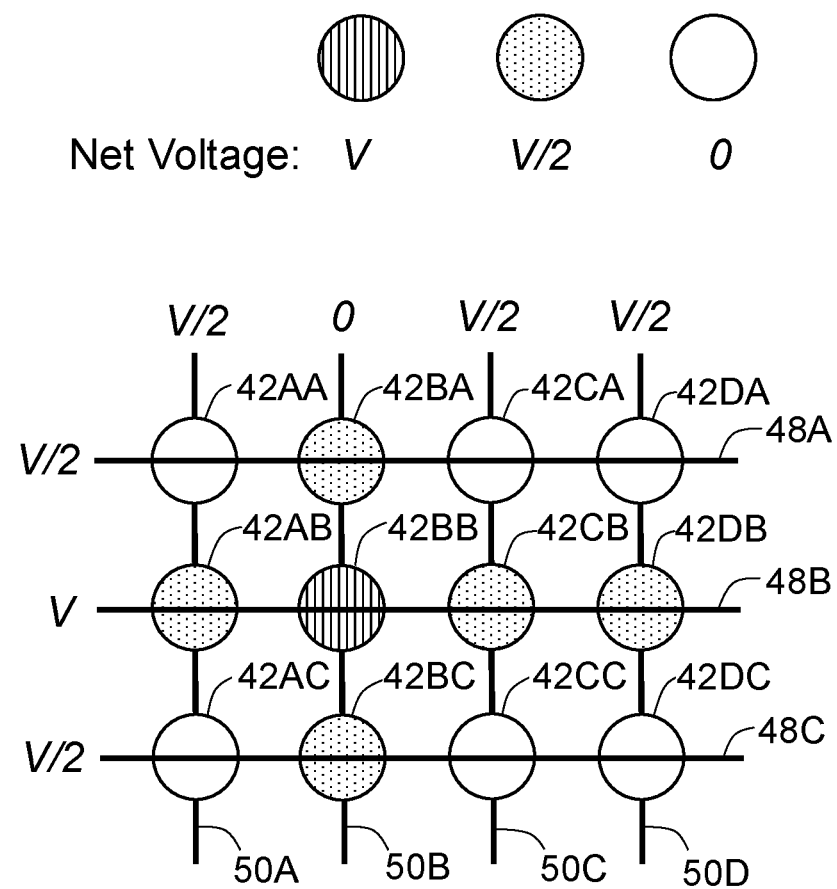
FIG. 5 illustrates a cell selection scheme for the memory array of FIG. 2.
Figure 6A:
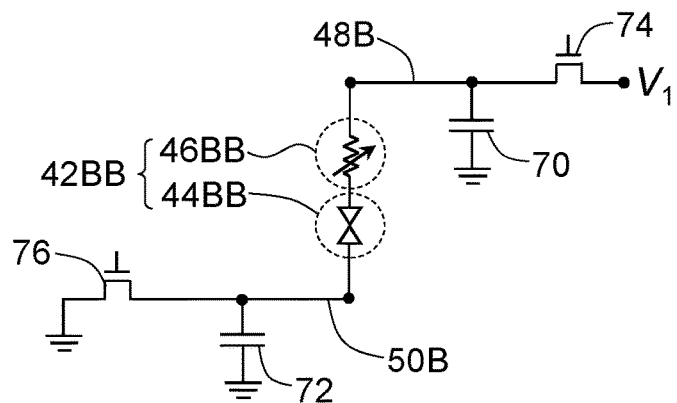
FIG. 6A is a schematic circuit diagram of a selected memory cell and components connected thereto.
Figure 6B:
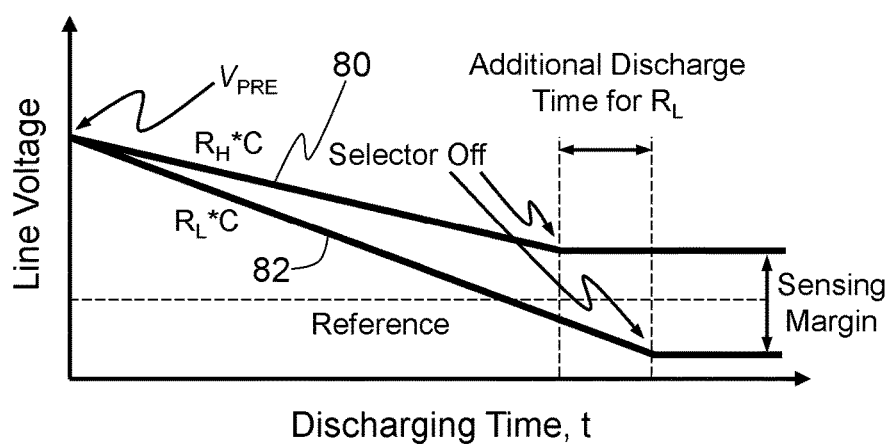
FIG. 6B is a plot showing the voltage decay of the first conductive line of FIG. 6A when the memory cell is in the high and low resistance states.

An embodiment of the present invention as applied to a sensing scheme for determining the resistance state of a memory cell including therein a two-terminal bi-direction selector, such as one of the memory cells 42 shown in FIGS. 2 and 5, will now be described with reference to FIGS. 6A and 6B. FIG. 6A is a schematic circuit diagram showing the memory cell 42BB selected for sensing operation and electrical components connected thereto. The memory cell 42BB, which includes the memory element 46BB and the two-terminal bi-directional selector 44BB coupled in series, is disposed between the first conductive line 48B and the second conductive line 50B. The first conductive line 48B has an inherent or parasitic capacitance represented by a first capacitor 70 coupled thereto. Similarly, the second conductive line 50B has an inherent or parasitic capacitance represented by a second capacitor 72 coupled thereto. One end of the first conductive line 48B is coupled to one of the source and drain of a first transistor 74. The other one of the source and drain of the first transistor 74 is at a voltage of $V_1$. One end of the second conductive line 50B is connected to one of the source and drain of a second transistor 76. The other one of the source and drain of the second transistor 76 is grounded. The first conductive line 48B may be a word line or bit line. The second conductive line 50B may be a bit line or source line.

The sensing operation may begin by first precharging the first conductive line 48B to $V_1$ by turning on the first transistor 74 while leaving the second transistor 76 off. In an embodiment, $V_1$ is a precharge voltage ($V_{PRE}$) that is greater than the cell voltage required to turn on the selector 44BB. After the first conductive line 48B reaches $V_{PRE}$, the first transistor 74 is turned off, leaving the potential of the first conductive line 48B to float at approximately $V_{PRE}$. The second transistor 76 is then turned on, thereby grounding the second conductive line 50B and initiating an RC discharging process as illustrated in FIG. 6B. The plot in FIG. 6B shows the voltage of the first conductive line 48B as a function of the discharging time when the memory element 46BB is in the high resistance state ($R_H$) 80 and the low resistance state ($R_L$) 82. The voltage decay of the first conductive line 48B may be mostly caused by the resistance of the memory element 46BB and the parasitic capacitance of the first conductive line 48B. Therefore, the voltage decreases slower when the memory element 46BB is in the high resistance state. Moreover, when the voltage of the first conductive line 48B drops below the cell voltage required to maintain the selector 44BB in the conductive state, the selector 44BB turns off and the discharging process for the first conductive line 48B essentially stops. Therefore, when the memory element 46BB is in the high resistance state, the voltage decay process shown in FIG. 6B will stop earlier because the cell voltage required to maintain the selector 44BB in the conductive state is higher. The additional discharging time when the memory element 46BB is in the low resistance state further increases the sensing margin as shown in FIG. 6B. Accordingly, the voltage of the first conductive line 48B may be measured at a time period (sense time) after the selector 44BB is turned off when the memory element 46BB is in the low resistance state, thereby maximizing the sensing margin. If the measured voltage of the first conductive line 48B is above a reference value, then the memory element 46BB is in the high resistance state. Otherwise, the memory element 46BB may be in the low resistance state.

Figure 2:
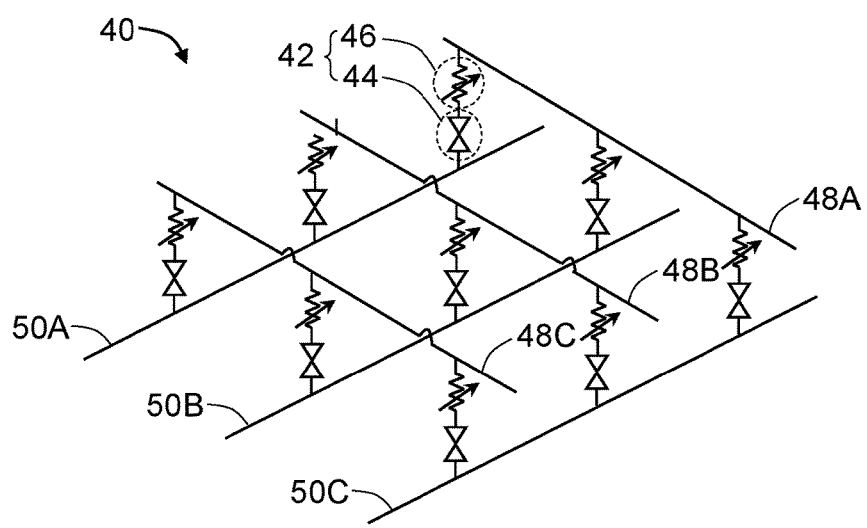
FIG. 2 is a schematic circuit diagram of a memory array including a plurality of memory cells with each comprising a memory element and a two-terminal selector coupled in series between two electrodes.
Figure 3:
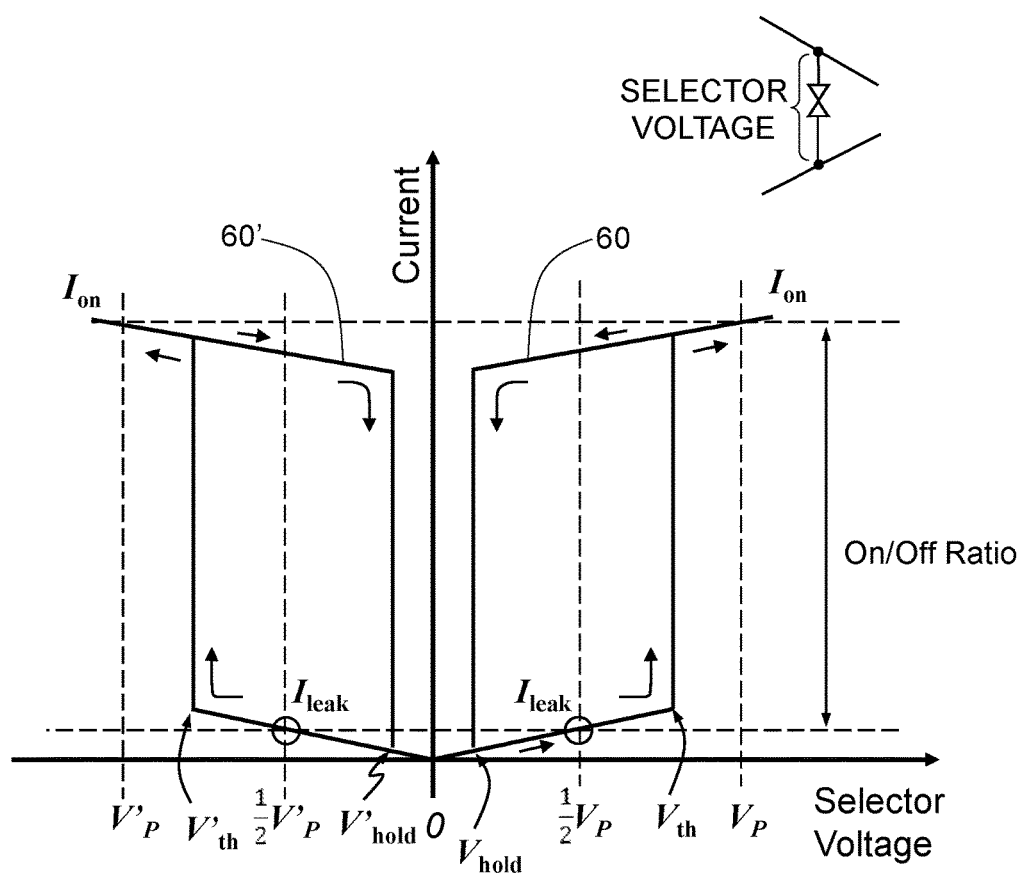
FIG. 3 is an I-V response plot for a two-terminal selector.
Figure 4:
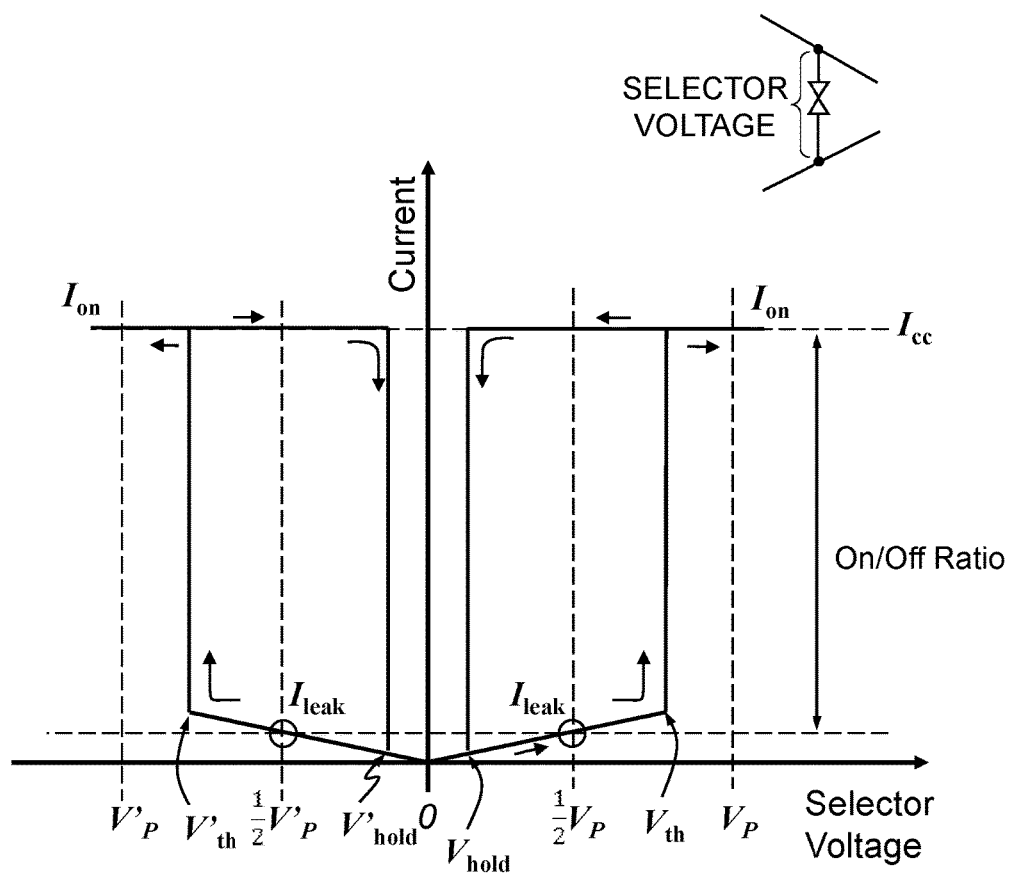
FIG. 4 is another I-V response plot for a two-terminal selector.
Figure 7:
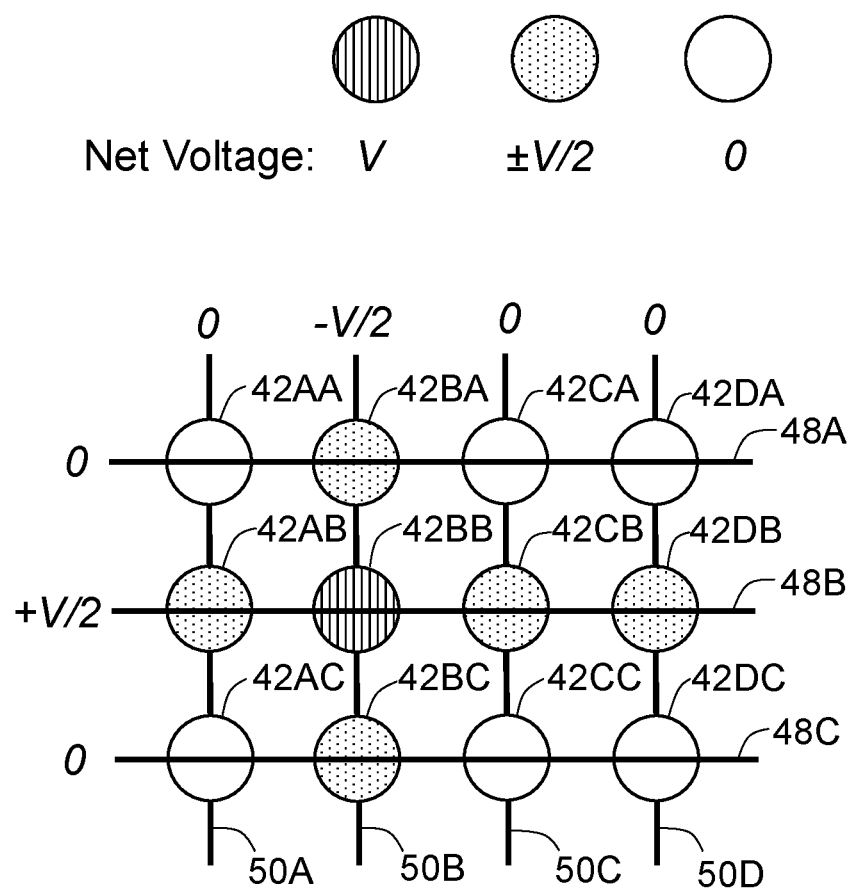
FIG. 7 illustrates another cell selection scheme for the memory array of FIG. 2.

FIG. 7 illustrates an alternative scheme for selecting a memory cell in the memory array 40 of FIG. 2 for sensing or programming by turning on the selector of the cell. Referring now to FIG. 7, the memory cell 42BB is selected by applying a first voltage, +V/2, to one of the first conductive lines 48B coupled thereto and a second voltage, −V/2, to one of the second conductive lines 50B coupled thereto, thereby generating a potential difference of V across the memory cell 42BB. Meanwhile, the unselected second conductive lines 50A, 50C-D and the unselected first conductive lines 48A, 48C are grounded. The application of +V/2 to the selected first conductive line 48B results in a potential difference of V/2 across the unselected memory cells 42AB, 42CB, 42DB coupled thereto. Similarly, application of −V/2 to the selected second conductive line 50B results in a potential difference of V/2 across the unselected memory cells 42BA, 42BC coupled thereto. The potential difference of V is greater than $V_{th}$ to ensure that the selector of the memory cell 42BB becomes conductive, while the potential difference of V/2 is not high enough for the selectors of the unselected memory cells 42BA, 42BC, 42AB, 42CB, and 42DB to become conductive. The rest of the unselected memory cells 42AA, 42CA, 42DA, 42AC, 42CC, and 42DC that are not connected to the selected first conductive line 48B or the selected second conductive line 50B experience essentially no potential drop thereacross.

Figure 8A:
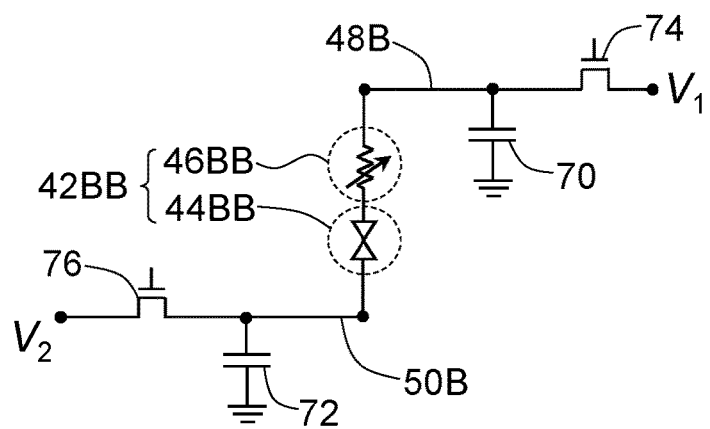
FIG. 8A is another schematic circuit diagram of a selected memory cell and components connected thereto.

Using the alternative cell selection scheme illustrated in FIG. 7, the sensing of the resistance state of the memory cell 42BB will be described with reference to FIG. 8A. The schematic circuit diagram of FIG. 8A is similar to that of FIG. 6A except that the other one of the source and drain of the second transistor 76 is at a voltage of $V_2$ instead of being grounded. The sensing operation may begin by first turning on the second transistor 76 to allow the selected second conductive line 50B to attain the voltage of $V_2$, following which the second transistor 76 is turned off. The first transistor 74 is then turned on to charge the selected first conductive line 48B to the voltage of $V_1$, thereby creating a potential drop of $V_1-V_2$ across the selected memory cell 42BB. Alternatively, the potential drop of $V_1-V_2$ across the selected memory cell 42BB may be attained by turning on the first and second transistors 74 and 76 simultaneously. The potential drop of $V_1-V_2$ is equal to a precharge voltage ($V_{PRE}$) that is greater than the cell voltage required to turn on the selector 44BB. In an embodiment, $V_1$ is $+V_{PRE}/2$ and $V_2$ is $-V_{PRE}/2$.

Figure 8B:
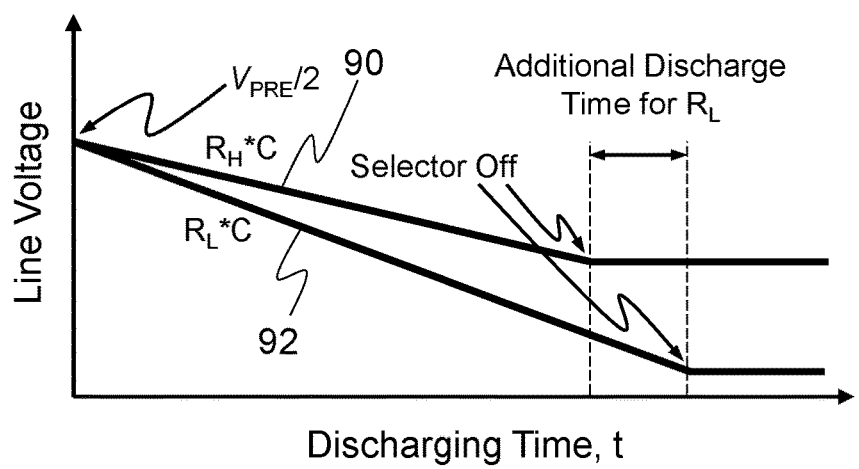
FIG. 8B is a plot showing the voltage decay of the first conductive line of FIG. 8A when the memory cell is in the high and low resistance states.

After reaching the potential drop of $V_{PRE}$ across the selected memory cell 42BB, the first transistor 74 is turned off, leaving the potential of the first conductive line 48B to float at approximately $V_{PRE}/2$. The second transistor 76 is then turned on, thereby initiating an RC discharging process as illustrated in FIG. 8B. The plot in FIG. 8B shows the voltage of the first conductive line 48B as a function of the discharging time when the memory element 46BB is in the high resistance state ($R_H$) 90 and the low resistance state ($R_L$) 92, similar to that shown in FIG. 6B except the voltage decay starts at $V_{PRE}/2$ instead of $V_{PRE}$. When the potential across the selected memory cell 42BB drops below the cell voltage required to maintain the selector 44BB in the conductive state, the selector 44BB turns off and the discharging process for the first conductive line 48B essentially stops. Therefore, when the memory element 46BB is in the high resistance state, the voltage decay process shown in FIG. 8B will stop earlier because the cell voltage required to maintain the selector 44BB in the conductive state is higher. The additional discharging time when the memory element 46BB is in the low resistance state further increases the sensing margin. Accordingly, the voltage of the first conductive line 48B may be measured at a time (sense time) after the selector 44BB is turned off when the memory element 46BB is in the low resistance state, thereby maximizing the sensing margin. If the measured voltage of the first conductive line 48B is above a reference value, then the memory element 46BB is in the high resistance state. Otherwise, the memory element 46BB may be in the low resistance state.

Figure 9:
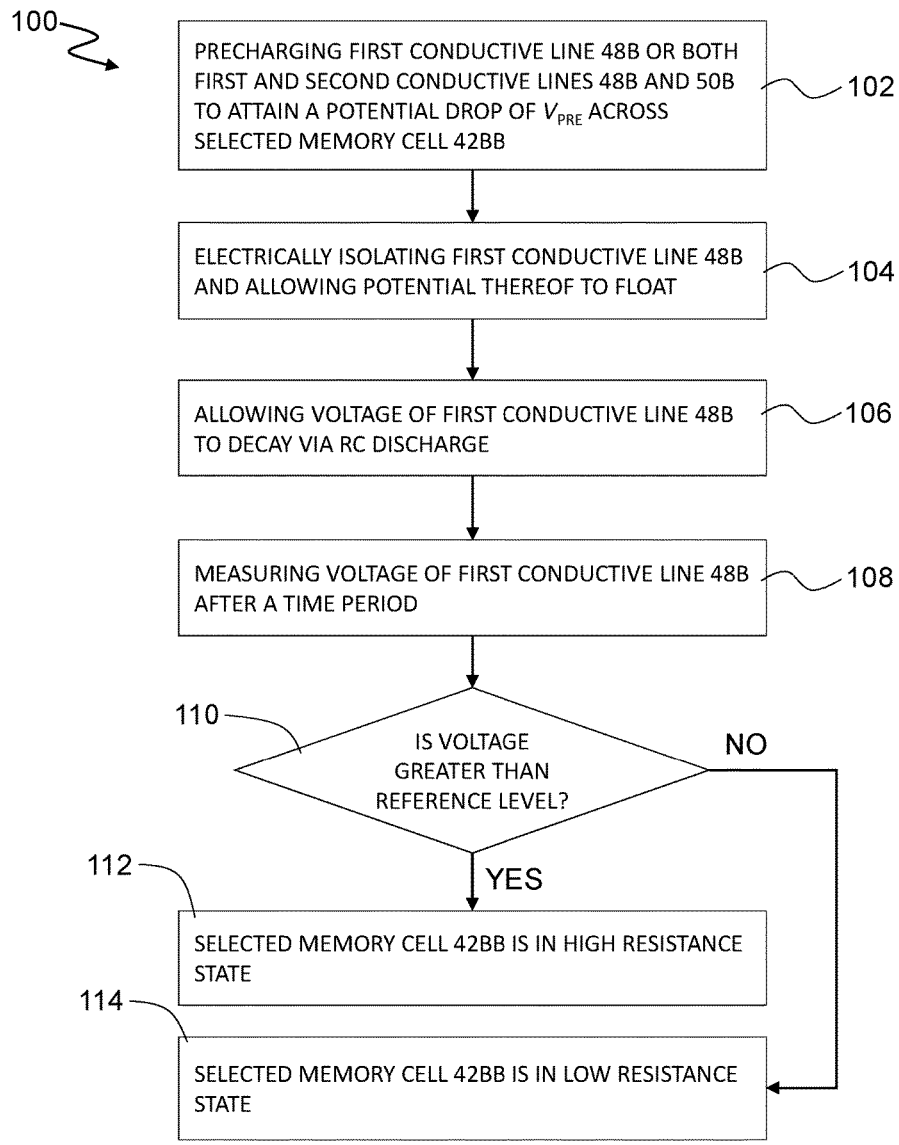
FIG. 9 is a flow chart illustrating selected steps of a method embodiment for sensing the resistance state of a memory cell that includes a memory element and a two-terminal selector coupled in series.

A flow chart illustrating selected steps 100 for an exemplary method of sensing the resistance state of the memory cell 42BB in accordance with the embodiments of FIGS. 6A/B and 8A/B is shown in FIG. 9. The sensing steps 100 begin by precharging the selected first conductive line 48B or both the selected first and second conductive lines 48B and 50B at step 102 to attain a potential drop of $V_{PRE}$ across the selected memory cell 42BB, where $V_{PRE}$ is a precharge voltage that is greater than the cell voltage required to turn on the selector 44BB. Therefore, the selector 44BB is conductive or "on" in the precharge state. The potential drop of $V_{PRE}$ across the selected memory cell 42BB may be attained by, for example, precharging the first conductive line 48B to $V_{PRE}$ or precharging the first and second conductive lines 48B and 50B to $+V_{PRE}/2$ and $-V_{PRE}/2$, respectively. The present invention is not limited to the two precharge voltage conditions described above. Other combinations of precharge voltages for the first and second conductive lines 48B and 50B may also be utilized. For example, the first and second conductive lines 48B and 50B may be precharged to $+\frac{2}{3}V_{PRE}$ and $-\frac{1}{3}V_{PRE}$, respectively.

Next, at step 104, the first conductive line 48B is electrically isolated, thereby rendering the potential thereof to float. Step 104 may be accomplished by turning off the first transistor 74 coupled to the first conductive line 48B. The second transistor 76, which is coupled to the second conductive line 50B, may also need to be turned off if the second conductive line 50B was precharged in the previous step 102.

Following step 104, the process continues to step 106, where the voltage of the first conductive line 48B is allowed to decay via RC discharge. The discharge process may be accomplished by grounding the second conductive line 50B or biasing the second conductive line 50B to a negative potential (e.g., $V_{PRE}/2$). The voltage decay of the first conductive line 48B may be mostly caused by the resistance of the memory element 46BB and the parasitic capacitance of the first conductive line 48B. Therefore, the voltage decreases slower when the memory element 46BB is in the high resistance state. Moreover, the voltage of the first conductive line 48 may stop decaying when the potential across the selected memory cell 42BB drops below the cell voltage required to maintain the selector 44BB in the conductive state, thereby disconnecting the first conductive line 48B from the second conductive line 50B. Accordingly, when the memory element 46BB is in the high resistance state, the voltage decay process will stop earlier because the cell voltage required to maintain the selector 44BB in the conductive state is higher.

Next, at step 108, the decayed voltage of the first conductive line 48B is measured after a time period to determine whether the memory element 46BB of the memory cell 42BB is in the high or low resistance state. In an embodiment, the length of the time period is shorter than the shut-off time of the selector 44BB if the memory element 46BB is in the high resistance state, i.e., the voltage of the first conductive line 48B is still decaying irrespective of the resistance state of the memory element 46BB. In another embodiment, the length of the time period is longer than the shut-off time of the selector 44BB if the memory element 46BB is in the high resistance state but shorter than the shut-off time of the selector 44BB if the memory element 46BB is in the low resistance state, i.e., the voltage of the first conductive line 48B stops decaying if the memory element 46BB is in the high resistance state but is still decaying if the memory element 46BB is in the low resistance state. In still another embodiment, the length of the time period is longer than the shut-off time of the selector 44BB if the memory element 46BB is in the low resistance state, i.e., the voltage of the first conductive line 48B stops decaying irrespective of the resistance state of the memory element 46BB.

The sensing steps 100 proceed by comparing the measured voltage to a reference level at step 110. If the measured voltage is greater than the reference level, then the memory element 46BB of the selected memory cell 42BB is in the high resistance state as outlined at step 112. Conversely, if the measured voltage is less than the reference level, then the memory element 46BB of the selected memory cell 42BB is in the low resistance state as outlined at step 114.

Figure 10:
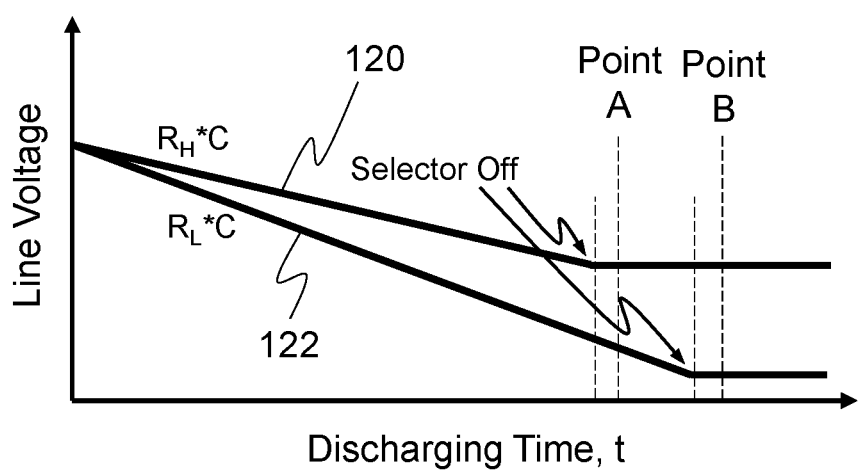
FIG. 10 is a plot showing the measurement of voltage decay of the first conductive line of FIGS. 6A and 8A at multiple points.

In another embodiment of the present invention as applied to a method for sensing the resistance state of the selected memory cell 42BB, the decayed voltage of the first conductive line 48B is measured at multiple time points as illustrated in FIG. 10. The plot in FIG. 10 shows the voltage of the first conductive line 48B as a function of the discharging time when the memory element 46BB is in the high resistance state ($R_H$) 120 and the low resistance state ($R_L$) 122, similar to those shown in FIGS. 6B and 8B. Instead of measuring a voltage value after a time period and comparing the measured voltage value to a pre-determined reference value as described in the flow chart of FIG. 9, the voltage of the first conductive lines 48B may be measured, for example, at two different time points—Point A and Point B. The voltage difference between the two points or the slope between the two points may be compared to a reference value to determine the resistance state of the selected memory cell 42BB. Since the voltage of the first conductive line 48BB will decay slower if the memory element 46BB of the selected memory cell 42BB is in the high resistance state, the memory element 46BB of the selected memory cell 42BB will be in the low resistance state if the voltage difference or the slope is greater than the reference value. Conversely, the memory element 46BB of the selected memory cell 42BB will be in the high resistance state if the voltage difference or the slope is less than the reference value.

With continuing reference to FIG. 10, to increase the sensing margin, Point A may fall within a time period during which the voltage is still decaying if the selected memory cell 42BB is in the low resistance state but stops decaying if the selected memory cell 42BB is in the high resistance state. Point B may fall within a time period during which the voltage of the first conductive line 48B stops decaying irrespective of the resistance state of the memory element 46BB. Other measurement time points may be used. For example, one of the points may fall within a time period during which the voltage is still in the process of decaying irrespective of the resistance state of the memory element 46BB. While the exemplary embodiment in FIG. 10 shows two measurement points, additional measurement points may be utilized.

Figure 11:
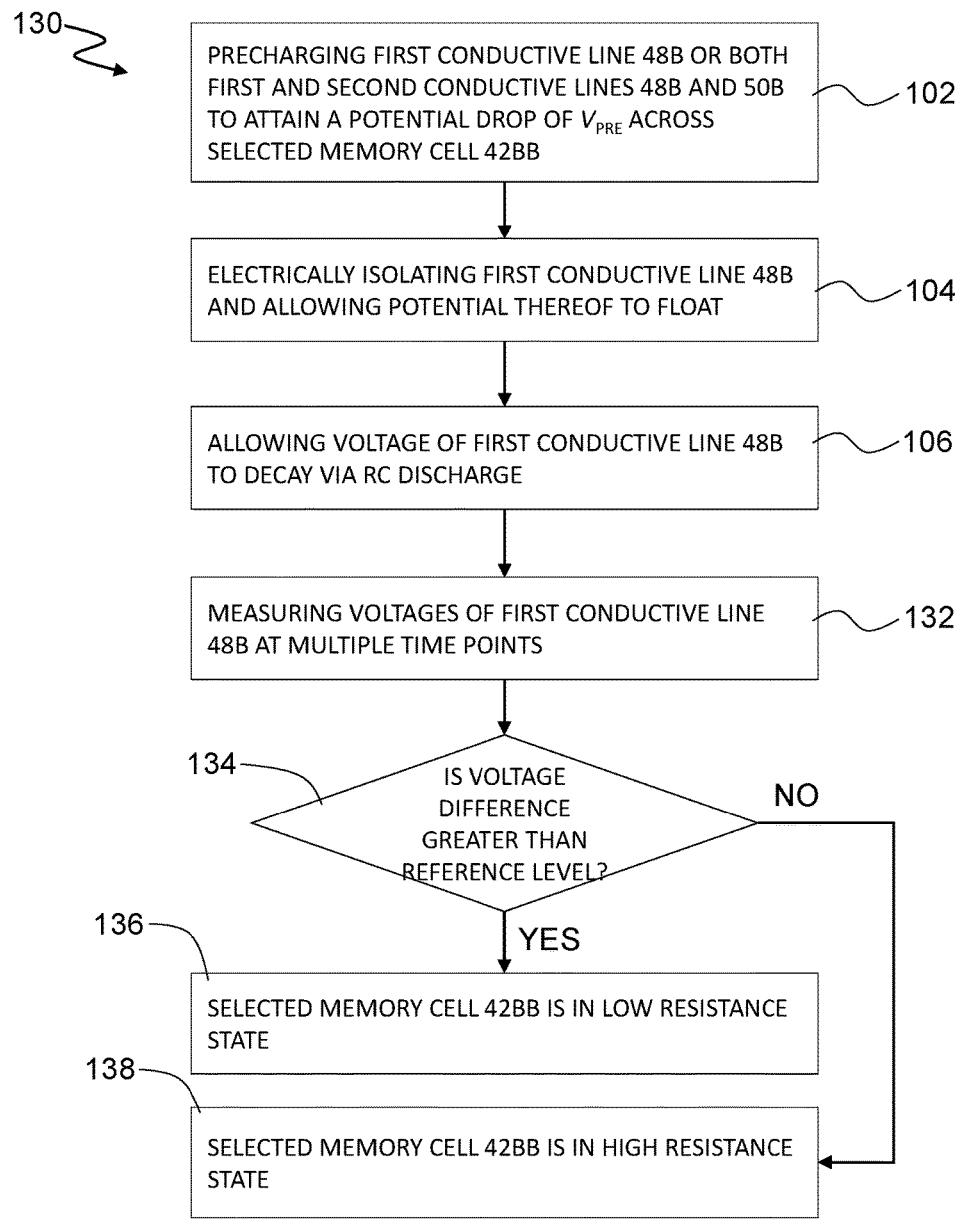
FIG. 11 is another flow chart illustrating selected steps of a method embodiment for sensing the resistance state of a memory cell that includes a memory element and a two-terminal selector coupled in series.

A flow chart illustrating selected steps 130 for an exemplary method of sensing the resistance state of the memory cell 42BB in accordance with the embodiment of FIG. 10 is shown in FIG. 11. The precharging process at step 102, the electrical isolation process at step 104, and the voltage discharge process at step 106 are analogous to steps 102-106 described above for the method embodiment of FIG. 9. After allowing the voltage of the first conductive line 48B to decay at step 106, the process continues to step 132, where the decayed voltages are measured at multiple time points.

Next, at step 134, the voltage difference between the multiple measurements or the slope defined by the multiple measurements is compared to a reference value. If the voltage difference or slope is greater than the reference value, then the memory element 46BB of the selected memory cell 42BB is in the low resistance state as outlined at step 136. Conversely, if the voltage difference or slope is less than the reference value, then the memory element 46BB of the selected memory cell 42BB is in the high resistance state as outlined at step 138.

Figure 1:
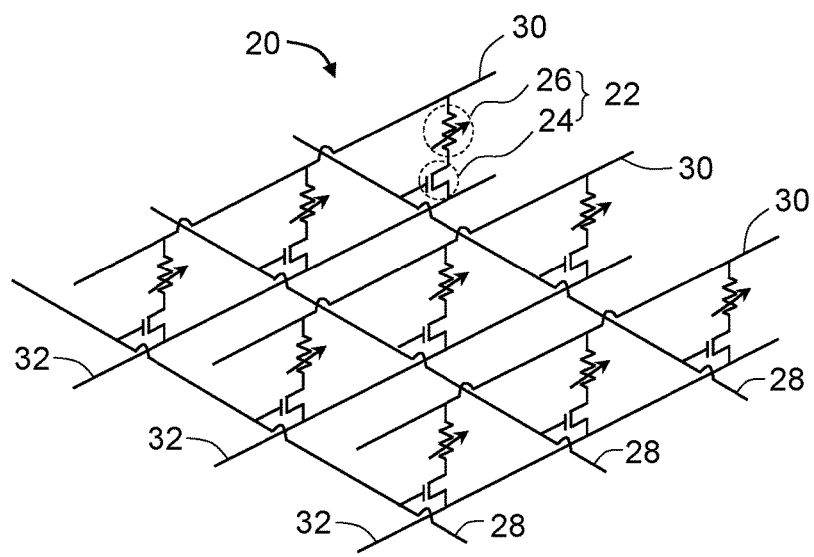
FIG. 1 is a schematic circuit diagram of a memory array including a plurality of memory cells with each comprising a memory element and a selection transistor coupled in series between two electrodes.
Figure 12A:
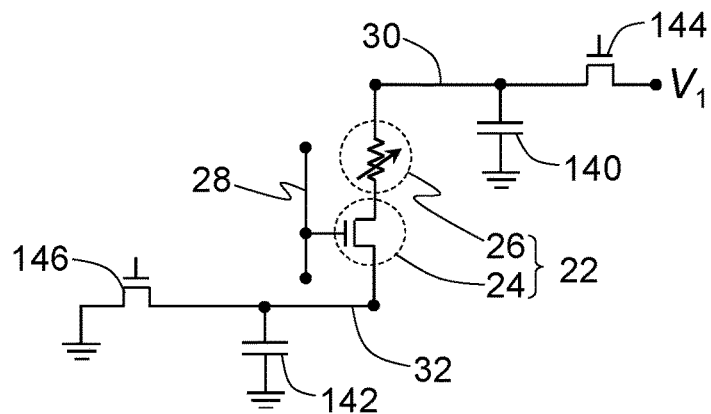
FIG. 12A is a schematic circuit diagram of a selected memory cell and components connected thereto.

The transient sensing method of the present invention may also be applied to a memory cell that utilizes a transistor as the selection element as shown in FIG. 1. An embodiment of the present invention as applied to a sensing scheme for determining the resistance state of a memory cell including therein a selection transistor, such as one of the memory cells 22 shown in FIG. 1, will now be described with reference to FIGS. 12A and 12B. FIG. 12A is a schematic circuit diagram showing a memory cell 22 selected for a sensing operation and electrical components connected thereto. The selected memory cell 22, which includes the memory element 26 and the selection transistor 24 coupled in series, is disposed between a selected bit line 30 and a source line 32. A selected word line 28 is coupled to the gate of the selection transistor 24. The bit line 30 has an inherent or parasitic capacitance represented by a first capacitor 140 coupled thereto. Similarly, the source line 32 has an inherent or parasitic capacitance represented by a second capacitor 142 coupled thereto. One end of the bit line 30 is coupled to one of the source and drain of a first transistor 144. The other one of the source and drain of the first transistor 144 is at a voltage of $V_1$. One end of the source line 32 is connected to one of the source and drain of a second transistor 146. The other one of the source and drain of the second transistor 146 is grounded. Alternatively, the bit line 30 may serve as a source line, while the source line 32 may serve as a bit line.

Figure 12B:
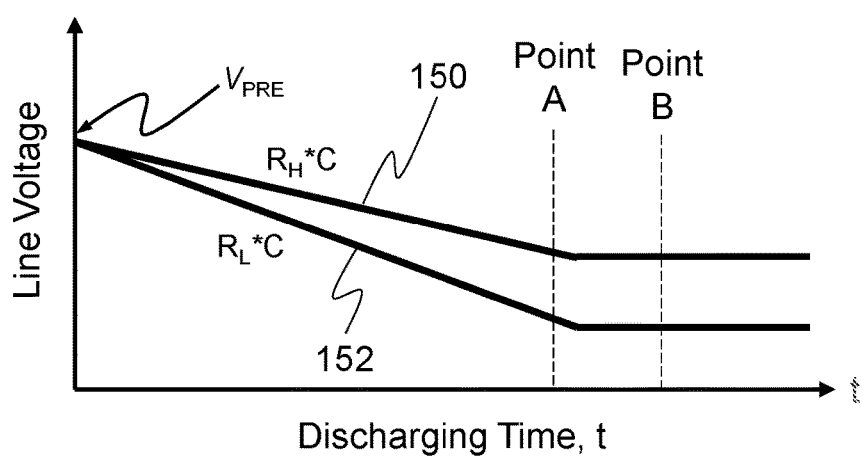
FIG. 12B is a plot showing the voltage decay of the first conductive line of FIG. 12A when the memory cell is in the high and low resistance states.

The sensing operation may begin by supplying a sufficiently high voltage to the word line 28 to turn on the selection transistor 24 and precharging the bit line 30 to $V_1$ by turning on the first transistor 144 while leaving the second transistor 146 off. In an embodiment, $V_1$ is a precharge voltage ($V_{PRE}$) that is less than the cell voltage required to switch the resistance state of the memory element 26. After the bit line 30 reaches $V_{PRE}$, the first transistor 144 is turned off, leaving the potential of the bit line 30 to float at approximately $V_{PRE}$. The second transistor 146 is then turned on, thereby grounding the source line 32 and initiating an RC discharging process as illustrated in FIG. 12B. The plot in FIG. 12B shows the voltage of the bit line 30 as a function of the discharging time when the memory element 26 is in the high resistance state ($R_H$) 150 and the low resistance state ($R_L$) 152. The voltage decay of the bit line 30 may be mostly caused by the resistance of the memory element 26 and the parasitic capacitance of the bit line 30. Therefore, the voltage decreases slower when the memory element 26 is in the high resistance state. Accordingly, the voltage of the bit line 30 may be measured at a time period (e.g., Point B) after the initiation of the RC discharging process. If the measured voltage of the bit line 30 is above a reference value, then the memory element 26 is in the high resistance state. Otherwise, the memory element 26 may be in the low resistance state.

With continuing reference to FIG. 12B, the voltage of the bit line 30 may alternatively be measured at multiple points like the method embodiment illustrated in FIGS. 10 and 11 and described above. For example, the voltage of the bit line 30 may be measured at t=0 (i.e., $V_{PRE}$) and at Point A or B. The voltage difference between the two points or the slope between the two points may be compared to a reference value to determine the resistance state of the selected memory cell 22. Since the voltage of the bit line 30 will decay slower if the memory element 26 of the selected memory cell 22 is in the high resistance state, the memory element 26 of the selected memory cell 22 will be in the low resistance state if the voltage difference or the slope is greater than the reference value. Conversely, the memory element 26 of the selected memory cell 22 will be in the high resistance state if the voltage difference or the slope is less than the reference value.

The resistance-based memory elements 26 and 46 may change the resistance state thereof by any suitable switching mechanism, such as but not limited to phase change, precipitate bridging, magnetoresistive switching, or any combination thereof. In one embodiment, the memory elements 26 and 46 comprise a phase change chalcogenide compound, such as but not limited to $Ge_2Sb_2Te_5$ or AgInSbTe, which can switch between a resistive phase and a conductive phase. In another embodiment, the memory elements 26 and 46 comprise a nominally insulating metal oxide material, such as but not limited to NiO, $TiO_2$, or $Sr(Zr)TiO_3$, which can switch to a lower electrical resistance state as metal rich precipitates grow and link to form conductive paths upon application of an appropriate voltage. In still another embodiment, the memory elements 26 and 46 comprise a magnetic free layer and a magnetic reference layer with an insulating electron tunnel junction layer interposed therebetween, collectively forming a magnetic tunnel junction (MTJ). When a switching current is applied, the magnetic free layer would switch the magnetization direction thereof, thereby changing the electrical resistance of the MTJ. The magnetic free layer may have a variable magnetization direction substantially perpendicular to a layer plane thereof. The magnetic reference layer may have a fixed magnetization direction substantially perpendicular to a layer plane thereof. Alternatively, the magnetization directions of the magnetic free and reference layers may orientations that are parallel to layer planes thereof.

While the present invention has been shown and described with reference to certain preferred embodiments, it is to be understood that those skilled in the art will no doubt devise certain alterations and modifications thereto which nevertheless include the true spirit and scope of the present invention. Thus the scope of the invention should be determined by the appended claims and their legal equivalents, rather than by examples given.

Any element in a claim that does not explicitly state "means for" performing a specified function, or "step for" performing a specific function, is not to be interpreted as a "means" or "step" clause as specified in 35 U.S.C. § 112, ¶6. In particular, the use of "step of" in the claims herein is not intended to invoke the provisions of 35 U.S.C. § 112, ¶6.

What is claimed is:

1. A method for sensing a resistance state of a memory cell, which includes a magnetic tunnel junction (MTJ) memory element and a two-terminal selector coupled in series between first and second conductive lines, the method comprising the steps of:
   precharging at least the first conductive line to attain a potential drop across the memory cell that is sufficiently large to turn on the two-terminal selector;
   allowing a voltage of the first conductive line to decay by discharging through the second conductive line;
   measuring the voltage of the first conductive line after a discharge period to determine the resistance state of the memory cell;
   concluding that the memory cell is in a high resistance state if the measured voltage is greater than a reference level; and
   concluding that the memory cell is in a low resistance state if the measured voltage is less than the reference level,
   wherein the discharge period is longer than or equal to a time period required for the two-terminal selector to turn off during discharging when the memory cell is in the high resistance state.

2. The method of claim 1, wherein the first conductive line has a higher precharged potential than the second conductive line.

3. The method of claim 1, wherein the step of precharging includes precharging the second conductive line.

4. The method of claim 3, the first conductive line is precharged to a positive potential and the second conductive line is precharged to a negative potential.

5. The method of claim 1, wherein the step of allowing a voltage of the first conductive line to decay is accomplished by grounding the second conductive line.

6. The method of claim 1, wherein the step of allowing a voltage of the first conductive line to decay is accomplished by biasing the second conductive line to a negative potential.

7. The method of claim 1, wherein the discharge period is longer than or equal to a time period required for the two-terminal selector to automatically turn off during discharging when the memory cell is in the low resistance state.

8. The method of claim 1, wherein the discharge period is shorter than or equal to a time period required for the two-terminal selector to automatically turn off during discharging when the memory cell is in the low resistance state.

9. A method for sensing a resistance state of a memory cell, which includes a magnetic tunnel junction (MTJ) memory element and a two-terminal selector coupled in series between first and second conductive lines, the method comprising the steps of:
   precharging at least the first conductive line to attain a potential drop across the memory cell that is sufficiently large to turn on the two-terminal selector;
   allowing a voltage of the first conductive line to decay by discharging through the second conductive line; and
   measuring the voltage of the first conductive line after a first discharge period and a second discharge period that is different from the first discharge period and determining a voltage difference between the first and second discharge periods to ascertain whether the memory cell is in a low resistance state or a high resistance state.

10. The method of claim 9 further comprising steps of:
   concluding that the memory cell is in the low resistance state if an absolute value of the voltage difference is greater than a reference value; and
   concluding that the memory cell is in the high resistance state if the absolute value of the voltage difference is less than the reference value.

11. The method of claim 9, wherein the first conductive line has a higher precharged potential than the second conductive line.

12. The method of claim 9, wherein the step of allowing a voltage of the first conductive line to decay is accomplished by grounding the second conductive line.

13. The method of claim 9, wherein the step of allowing a voltage of the first conductive line to decay is accomplished by biasing the second conductive line to a negative potential.

* * * * *